(12) United States Patent
Chang et al.

(10) Patent No.: US 7,052,236 B2
(45) Date of Patent: May 30, 2006

(54) HEAT-DISSIPATING DEVICE AND HOUSING THEREOF

(75) Inventors: Shun-Chen Chang, Taipei (TW); Kuo-Cheng Lin, Taoyuan (TW); Wen-Shi Huang, Taoyuan (TW)

(73) Assignee: Delta Electronics, Inc., Taoyuan Sien (TW)

( * ) Notice: Subject to any disclaimer, the term of this patent is extended or adjusted under 35 U.S.C. 154(b) by 24 days.

(21) Appl. No.: 10/739,307

(22) Filed: Dec. 19, 2003

(65) Prior Publication Data

US 2004/0251000 A1    Dec. 16, 2004

(30) Foreign Application Priority Data

May 30, 2003    (TW) ................................ 92114644 A

(51) Int. Cl.
*F04D 29/54* (2006.01)
(52) U.S. Cl. ................ 415/191; 415/211.2; 415/219.1; 415/220
(58) Field of Classification Search ................ 415/185, 415/191, 208.2, 211.2, 221, 219.1, 220; 416/189
See application file for complete search history.

(56) References Cited

U.S. PATENT DOCUMENTS

| | | | | |
|---|---|---|---|---|
| 2,298,576 A | * | 10/1942 | McElroy et al. | 415/191 |
| 2,441,239 A | * | 5/1948 | Flanders | 415/207 |
| 2,538,739 A | * | 1/1951 | Troller | 415/211.2 |
| 3,846,039 A | * | 11/1974 | Stalker | 415/206 |
| 4,373,861 A | | 2/1983 | Papst et al. | |
| 6,398,492 B1 | * | 6/2002 | Cho et al. | 415/191 |
| 6,547,540 B1 | | 4/2003 | Horng et al. | |
| 6,814,542 B1 | * | 11/2004 | Marlander et al. | 415/219.1 |
| 2003/0026691 A1 | | 2/2003 | Huang et al. | |

FOREIGN PATENT DOCUMENTS

| | | |
|---|---|---|
| DE | 201 15 410 U1 | 1/2002 |
| TW | 0487303 Y | 5/2002 |

OTHER PUBLICATIONS

Lewis, "Turbomachinery Performance Analysis," Published by Arnold, Great Britain, 1996, pp. 138 and 180.
Janna, William S., "Introduction to Hydrodynamics," published by Wun Ching Publishing Group, 1995, pp. 508, with English language translation of the relevant portion thereof.

* cited by examiner

*Primary Examiner*—Ninh H. Nguyen
(74) *Attorney, Agent, or Firm*—Birch, Stewart, Kolasch & Birch, LLP

(57) ABSTRACT

A heat-dissipating device and a housing thereof. The heat-dissipating device includes an impeller and a housing. The impeller includes a hub and a plurality of rotor blades disposed around the hub. The housing includes an outer frame, an air-guiding part, and a plurality of stator blades. The air-guiding part is formed on at least one side of the outer frame. The stator blades are disposed in the outer frame corresponding to the air-guiding part. The stator blades guide the airflow through the blades, and greatly increase the static pressure of the airflow discharged from the heat-dissipating device.

22 Claims, 6 Drawing Sheets

HEAT-DISSIPATING DEVICE AND HOUSING THEREOF

This Nonprovisional application claims priority under 35 U.S.C. §119 (a) on Patent Application No. 092114644 filed in TAIWAN on May 30, 2003, the entire contents of which are hereby incorporated by reference.

BACKGROUND OF THE INVENTION

1. Field of the Invention

The invention relates to a heat-dissipating device and a housing thereof, and in particular, the invention relates to an axial-flow fan and a housing thereof.

2. Description of the Related Art

In a normal electronic product such as a computer, electronic devices therein generate a lot of heat during operation. If the electronic devices are continuously operated at high temperature, they are easily damaged. Thus, to prevent damage, a heat-dissipating fan is normally disposed in the electronic product to dissipate heat therein to the surrounding.

The conventional heat-dissipating fan for the computer mainly includes a housing 11 and an impeller 12 with a plurality of blades. As shown in FIG. 1A and FIG. 1B, the housing 11 includes a plurality of stick-shaped ribs 13 to support a base thereof. When the fan operates, the air pressure, generated by an airflow passing through the blades, is changed from P0 at an inlet side A to P1 at an outlet side B. That is, the pressure difference is $\Delta P$ (P1−P0). When the pressure difference increases, air resistance also increases, diminishing heat-dissipation. After studying the relationship between the shape of the rib and the air pressure of the fan, the inventor has discovered that the ribs generate air resistance. Specifically, when the fan rotates, work is done on the air to generate the airflow. However, after flowing through the ribs, the airflow becomes turbulent and forms a vortex. Thus, the air pressure is reduced, and the heat-dissipation is also reduced.

Thus, it is important to reduce the air resistance generated by the ribs. Additionally, it is desirable to utilize the tangent velocity of the airflow so as to enhance the air pressure.

SUMMARY OF THE INVENTION

In view of this, the invention provides a heat-dissipating fan and a housing thereof. Stator blades are provided in the housing of the invention, and the area of the housing is changed so that the axial velocity and the radial velocity are reduced. As a result, the static pressure of the fan can be largely increased.

Another purpose of the invention is to provide a heat-dissipating device and a housing thereof with low noise, high air flow, and high air pressure, to attain excellent heat-dissipation efficiency.

Accordingly, the invention provides a heat-dissipating device. The heat-dissipating device includes an impeller and a housing. The impeller includes a hub and a plurality of rotor blades disposed around the hub. The housing receives the impeller, and includes an outer frame, an air-guiding part, and a plurality of stator blades. The air-guiding part is formed on at least one side of the outer frame. The stator blades are disposed in the outer frame corresponding to the air-guiding part. The stator blades guide the airflow through the blades, and greatly increase the static pressure of the airflow discharged from the heat-dissipating device.

In a preferred embodiment, the radius of the hub is gradually reduced from one end to the other end.

In another preferred embodiment, the housing includes an inlet side and an outlet side, and the air-guiding part is located at the inlet side or the outlet side.

In another preferred embodiment, the depth of the air-guiding part is larger than half of the height of the stator blade. Alternatively, the height of the stator blade is larger than a fifth of the thickness of the outer frame.

In another preferred embodiment, the stator blades are disposed on the air-guiding part in the outer frame. The outer frame may be square, rectangular, or circular, and may be made of metal or plastic.

In another preferred embodiment, the heat-dissipating device further includes a base connected to the outer frame via the stator blades or ribs. One end of each of the stator blades is connected to the base, and the other end of each of the stator blades is extended toward the air-guiding part. Alternatively, one end of each of the stator blades is connected to the air-guiding part, and the other end of each of the stator blades is extended toward the base. Alternatively, the stator blades are radially arranged and connected between the base and an inner surface of the outer frame. Additionally, the outer frame, the base, the air-guiding part, and the stator blades are integrally formed by injection molding.

In another preferred embodiment, the outer frame includes an inlet side and an outlet side, and the air-guiding part is formed at the inlet side or the outlet side respectively. The air-guiding part located at the inlet side and the air-guiding part located outlet side are mirror-symmetrically positioned.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1A:
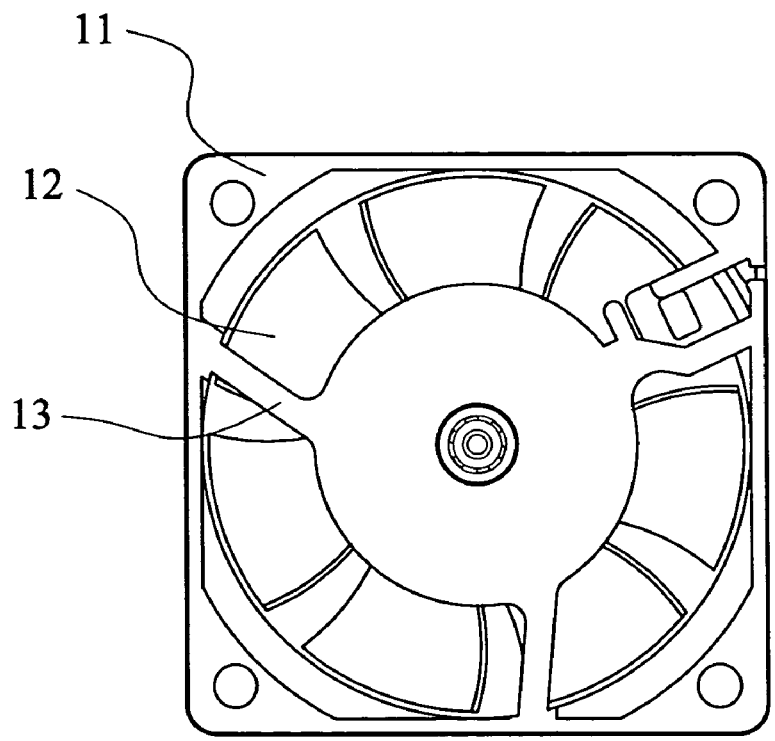
FIG. 1A is a bottom view of a conventional heat-dissipating fan.
Figure 1B:
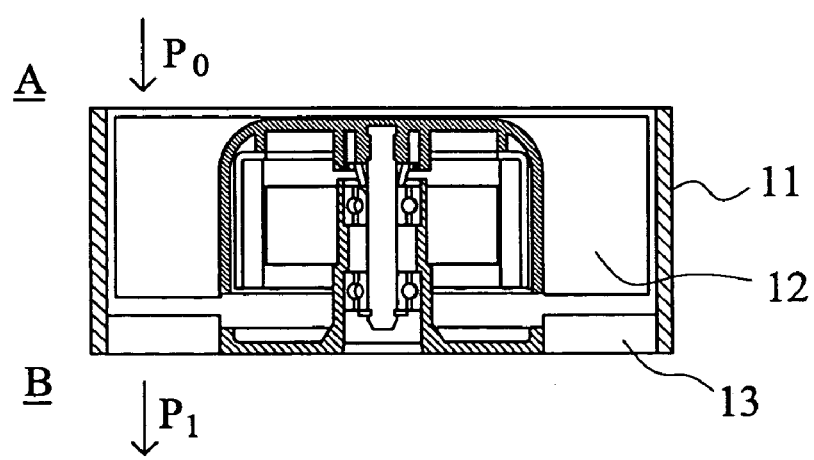
FIG. 1B is a cross section of the heat-dissipating fan in FIG. 1A.
Figure 2A:
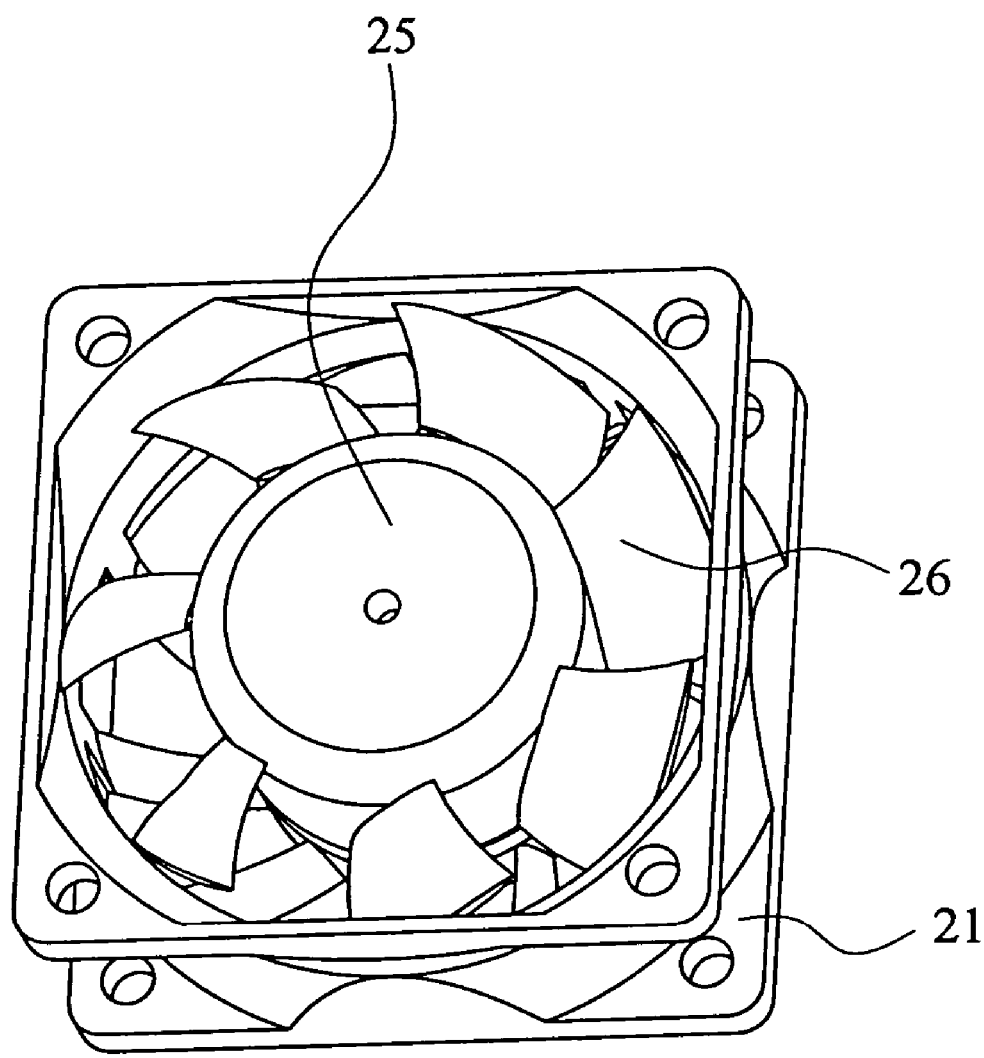
FIG. 2A is a perspective view of a heat-dissipating fan as disclosed in a preferred embodiment of the invention.
Figure 2B:
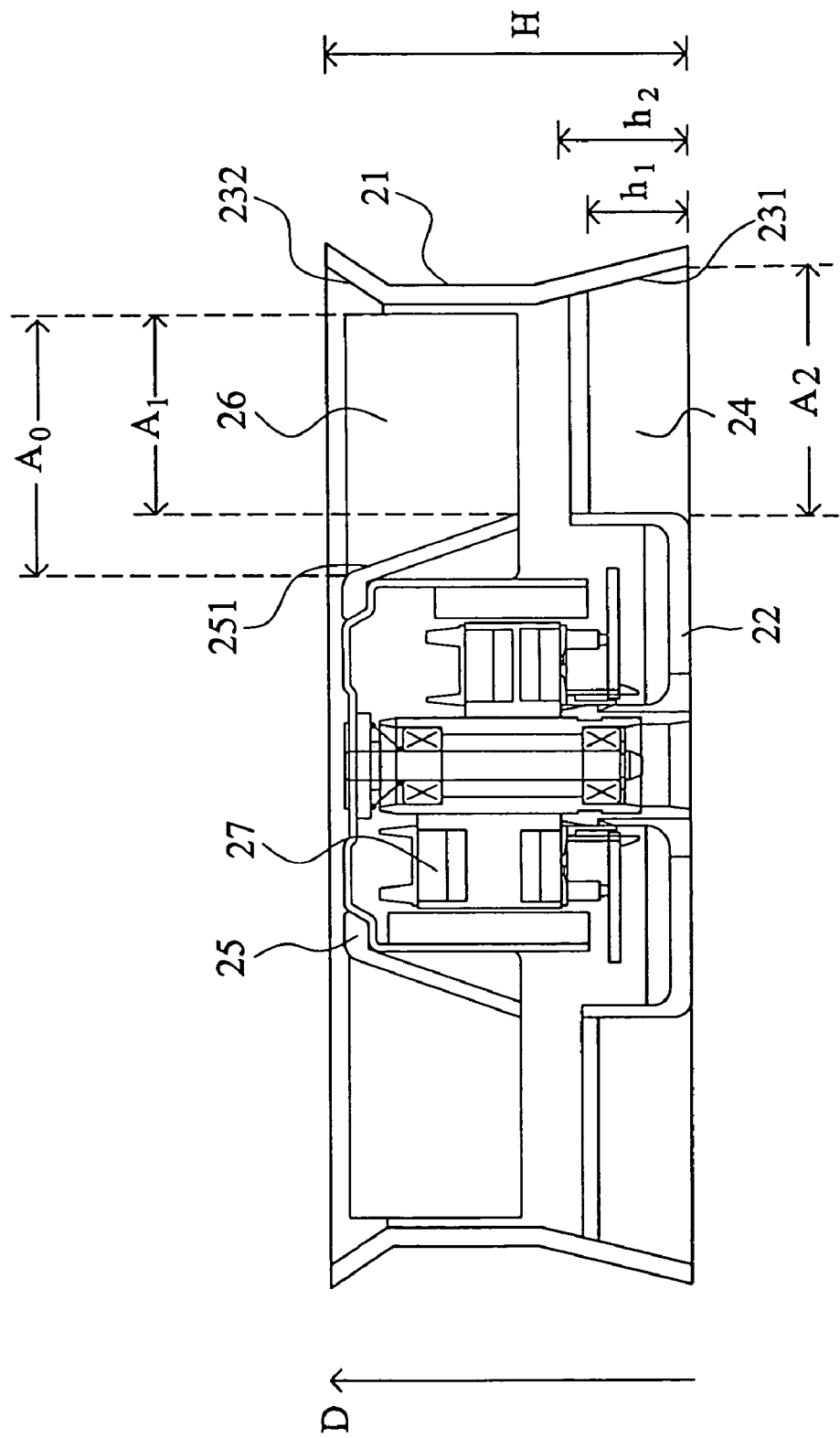
FIG. 2B is a cross section of the heat-dissipating fan in FIG. 2A.
Figure 3A:
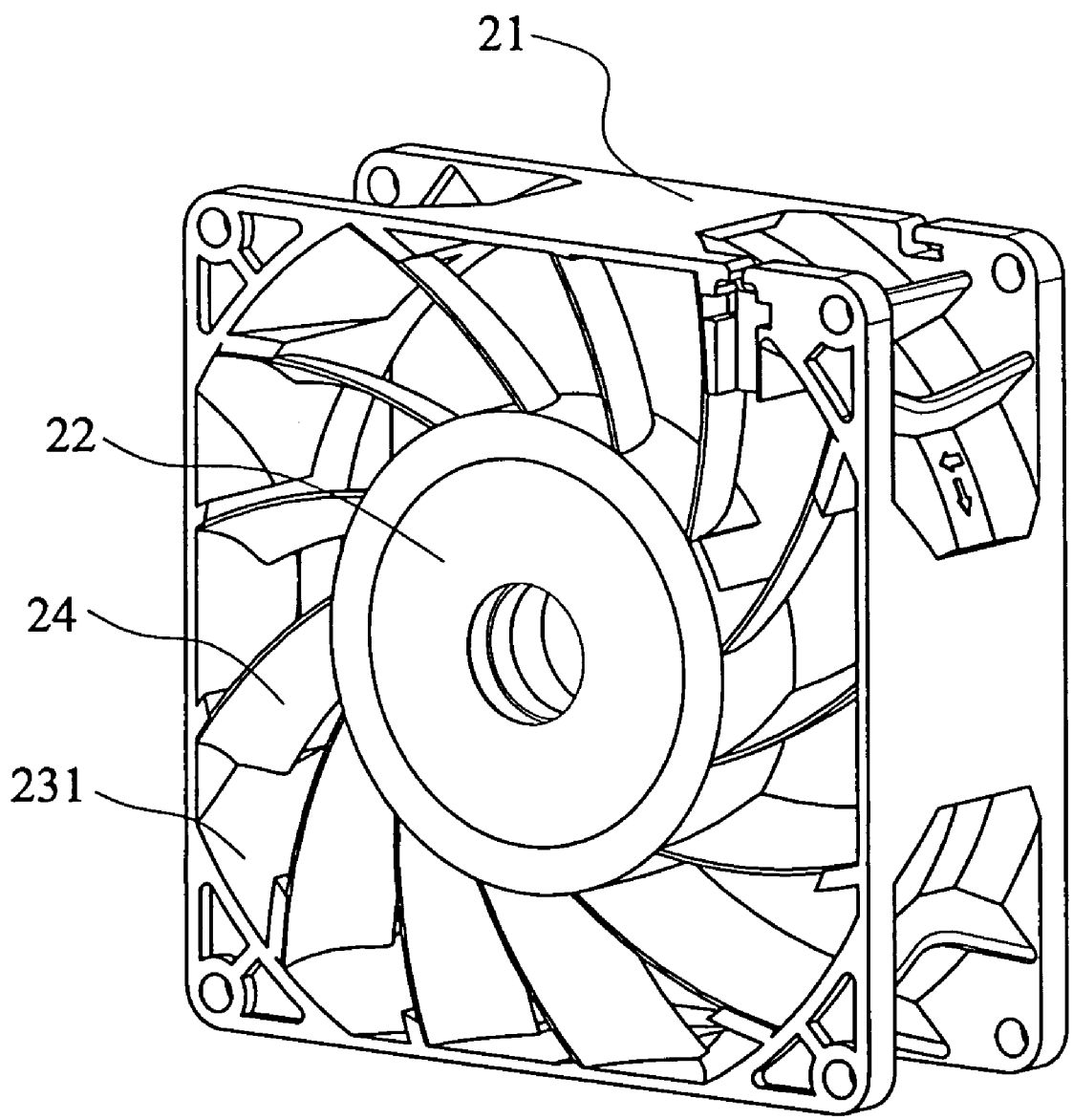
FIG. 3A is a perspective view of a housing in FIG. 2A.
Figure 3B:
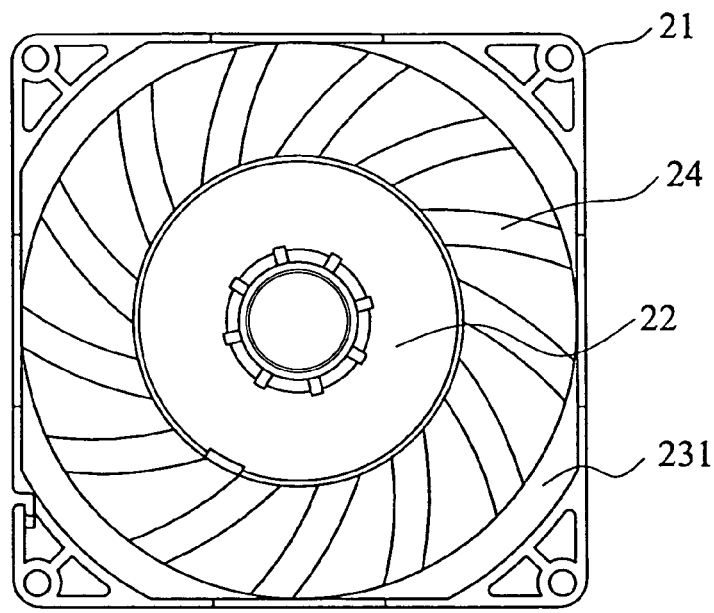
FIG. 3B and FIG. 3C are a top view and a bottom view of the housing in FIG. 3A respectively.
Figure 3C:
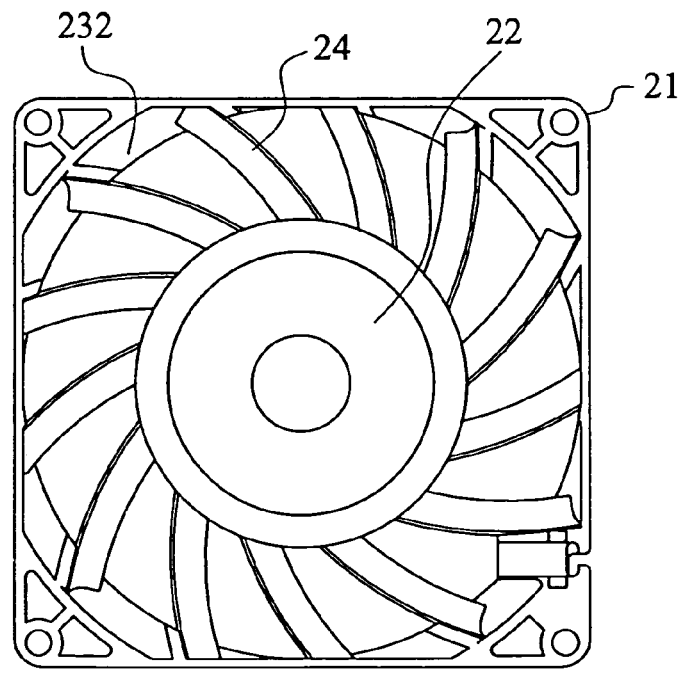

Referring to FIG. 2A and FIG. 2B, a heat-dissipating fan as disclosed in a first preferred embodiment of the invention is shown. The heat-dissipating fan includes an impeller, a motor 27, and a housing. The impeller includes a hub 25 and a plurality of rotor blades 26 disposed around the hub 25. The motor 27 is disposed in the hub 25 Referring to FIGS. 3A–3C, the housing receives the impeller, and includes an outer frame 21, a base 22, an air-guiding part (or referred to as a lead angle) 231, and a plurality of stator blades 24. The stator blades 24 are connected between the base 22 and the air-guiding part 23 in the outer frame 21. That is, the stator blades 24 are radially arranged and connected between the base 22 and an inner surface of the outer frame 21. The stator blades 24 can guide an airflow through the blades, and increase the static pressure of the airflow discharged from the heat-dissipating fan. Additionally, one end of each of the stator blades 24 may be connected to the base 22, and the other end of each of the stator blades 24 may be extended toward the air-guiding part 23. Alternatively, one end of each of the stator blades 24 may be connected to the air-guiding part 23, and the other end of each of the stator blades 24 may be extended toward the base 22, or vice versa. It is understood that the base 22 may be connected to the outer frame 21 via conventional fibs.

As shown in FIG. 2B, the housing includes the air-guiding part 231 at its inlet side and an air-guiding part 232 at its outlet side, respectively. Alternatively, the outer frame 21 includes the air-guiding part 231 at its inlet side and an air-guiding part 232 at its outlet side, wherein the air-guiding parts 231, 232 are mirror-symmetrically disposed. Additionally, the radius of the hub 25 is gradually reduced from one end to the other end in the direction indicated by arrow D so as to form an inclined surface 251 for smoothly guiding the air-flow. It is noted that the arrow D is from the outlet side to the inlet side.

Figure 4:
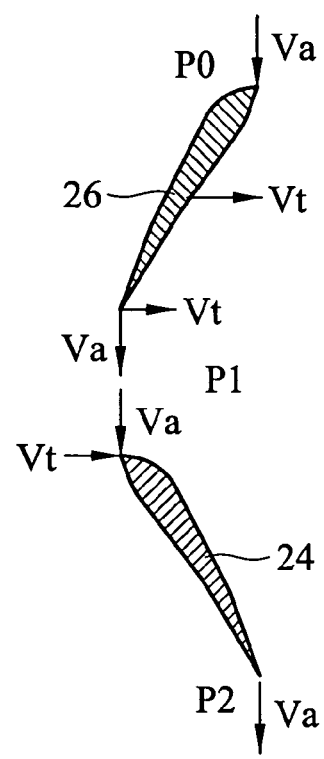
FIG. 4 is a schematic view showing an arrangement of rotor blades and stator blades in the heat-dissipating fan.

Referring to FIG. 4, a design theorem of the invention is described. It is noted that Va represents the velocity in an axial direction, Vt represents the velocity in a tangential direction, P0 represents a pressure of the airflow before passing through the rotor blades 26 of the impeller, P1 represents a pressure of the airflow after passing through the rotor blades 26 of the impeller, and P2 represents a pressure of the airflow after passing through the stator blades 24. According to Bernuli's Equation [$P2+0.5\times\rho\times Va^2=P1+0.5\times\rho(Va^2+Vt^2)$], the pressure difference is $\Delta P=P2-P1=0.5\times\rho\times Vt^2$.

By means of the design of the stator blades, Vt is substantially equal to zero. Additionally, as shown in FIG. 2B, the static pressure may be enhanced by means of the relationship between the area $A_1$ and $A_2$ shown in the figures according to the following equation.

$$\Delta P=0.5\times\rho\times[(Q/A_1)^2-(Q/A_2)^2]$$

It is noted that $\rho$ represents density of the air, and Q represents the amount of the air.

As previously noted, stator blades 24 are provided in the housing of the invention, and the area of the housing is changed so as to simultaneously reduce the axial velocity and the radial velocity. Thus, the static pressure of the fan can be largely increased. It is noted that to attain the above-described purpose, the height of the stator blade 24 and the depth of the air-guiding part 231 may have some limitations. Preferably, the depth h1 of the air-guiding part 231 is at least larger than half of the height h2 of the stator blade 24. Alternatively, the height h2 of the stator blade 24 is at least larger than a fifth of the thickness H of the outer frame 21, as shown in FIG. 2B. Additionally, by the variant relationship between the area A0 and the area A1, the turbulent flow can be prevented.

Figure 5:
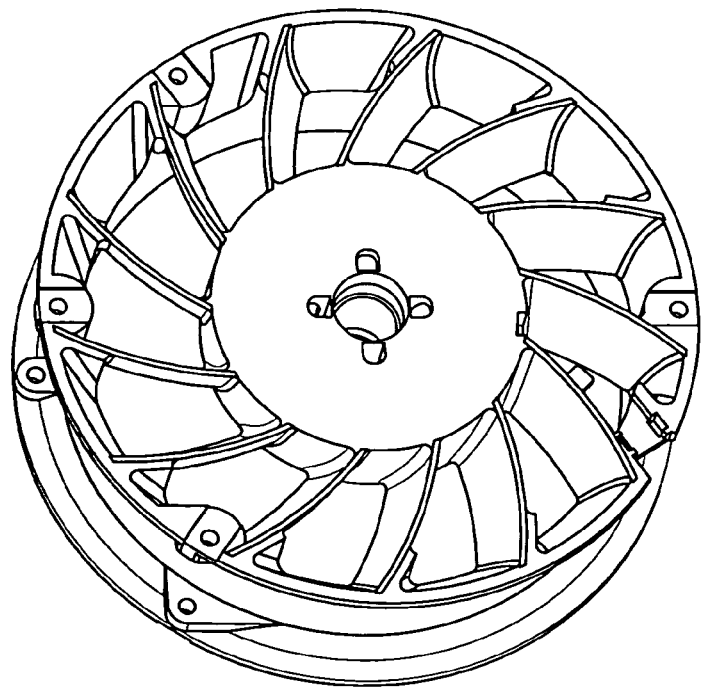
FIG. 5 is a perspective view of a variant embodiment of the housing.

The outer frame 21, the base 22, the air-guiding part 231, and the stator blades 24 may be integrally formed by injection molding. The outer frame 21 may be square, rectangular, or another shape. For example, the outer frame 21 may be circular as shown in FIG. 5. The air-guiding part 231 may be expanded outwardly in a radial direction. The outer frame 21 may be made of plastic, metal (such as aluminum), or other material with good thermal conductivity.

As stated above, in the heat-dissipating device and the housing thereof of the invention, the stator blades are provided in the housing of the invention, and the area of the housing is changed so that the axial velocity and the radial velocity are reduced, and the static pressure of the fan can be largely increased. As a result, the heat-dissipating device provides low noise, high air flow, and high air pressure. Moreover, better heat-dissipation can be attained.

While the invention has been described by way of example and in terms of the preferred embodiment, it is to be understood that the invention is not limited to the disclosed embodiment. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A housing for a heat-dissipating device, wherein the heat-dissipating device comprises a hub and a motor, comprising:
    an outer frame;
    an inlet side;
    a base mounted inside the outer frame for supporting the motor to be received in the hub;
    an air-guiding part located at the inlet side of the housing; and
    a plurality of stator blades disposed in the outer frame corresponding to the air-guiding part for guiding an airflow.

2. The housing as claimed in claim 1, wherein the housing includes an outlet side, and the air-guiding part is located at the outlet side.

3. The housing as claimed in claim 1, wherein the depth of the air-guiding part is larger than half of the height of the stator blade.

4. The housing as claimed in claim 1, wherein the height of the stator blade is larger than a fifth of the thickness of the outer frame.

5. The housing as claimed in claim 1, wherein the outer frame is square, rectangular, or circular.

6. The housing as claimed in claim 1, wherein the outer frame is made of metal, plastic, or one material with good thermal conductivity.

7. The housing as claimed in claim 1, further including a base connected to the outer frame via the stator blades or ribs.

8. The housing as claimed in claim 7, wherein one end of each of the stator blades is connected to the base, and the other end of each of the stator blades is extended toward the air-guiding part.

9. The housing as claimed in claim 7, wherein one end of each of the stator blades is connected to the air-guiding part, and the other end of each of the stator blades is extended toward the base.

10. The housing as claimed in claim 7, wherein the stator blades are radially arranged and connected between the base and an inner surface of the outer frame.

11. The housing as claimed in claim 7, wherein the outer frame, the base, the air-guiding part, and the stator blades are integrally formed by injection molding.

12. The housing as claimed in claim 1, wherein the outer frame includes an inlet side and an outlet side, and the air-guiding parts are formed at the inlet side and the outlet side of the outer frame, respectively.

13. The housing as claimed in claim 12, wherein the air-guiding part located at the inlet side and the air-guiding part located at the outlet side are mirror-symmetrically disposed.

14. A heat-dissipating device comprising:
   an impeller including a hub and a plurality of rotor blades disposed around the hub;
   a motor disposed in the hub; and
   a housing for receiving the impeller, wherein the housing includes:
      an outer frame including an inlet side and an outlet side;
      an air-guiding part respectively formed at the inlet side and the outlet side of the outer frame; and
      a plurality of stator blades disposed in the outer frame, corresponding to the air-guiding part, wherein the stator blades guide an airflow through the blades, and increase a static pressure of the airflow discharged from the heat-dissipating device.

15. The heat-dissipating device as claimed in claim 14, wherein the radius of the hub is gradually reduced from one end to the other end.

16. The heat-dissipating device as claimed in claim 14, wherein the depth of the air-guiding part is larger than half the height of the stator blade.

17. The heat-dissipating device as claimed in claim 14, wherein the height of the stator blade is larger than a fifth of the thickness of the outer frame.

18. The heat-dissipating device as claimed in claim 14, further including a base connected to the outer frame via the stator blades or ribs.

19. The heat-dissipating device as claimed in claim 18, wherein the stator blades are radially arranged between the base and an inner surface of the outer frame.

20. The heat-dissipating device as claimed in claim 18, wherein the outer frame, the base, the air-guiding part, and the stator blades are integrally formed by injection molding.

21. The heat-dissipating device as claimed in claim 14, wherein the air-guiding part located at the inlet side and the air-guiding part located at the outlet side are mirror-symmetrically disposed.

22. A heat-dissipating device comprising:
   an impeller including a hub and a plurality of rotor blades disposed around the hub;
   a motor disposed in the hub; and
   a housing for receiving the impeller, wherein the housing includes:
      an outer frame including an inlet side;
      an air-guiding part located at the inlet side of the outer frame; and
      a plurality of stator blades disposed in the outer frame, corresponding to the air-guiding part, wherein the stator blades guide an airflow through the blades, and increase a static pressure of the airflow discharged from the heat-dissipating device.

* * * * *